(12) United States Patent
Lee

(10) Patent No.: US 9,251,877 B2
(45) Date of Patent: Feb. 2, 2016

(54) SEMICONDUCTOR APPARATUS FOR CONTROLLING PHASE DIFFERENCE BETWEEN INPUT SIGNAL AND STROBE SIGNAL

(71) Applicant: SK hynix Inc., Icheon-si, Gyeonggi-do (KR)

(72) Inventor: Hyun Sung Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 14/193,659

(22) Filed: Feb. 28, 2014

(65) Prior Publication Data
US 2015/0155020 A1 Jun. 4, 2015

(30) Foreign Application Priority Data
Dec. 2, 2013 (KR) ........................ 10-2013-0148513

(51) Int. Cl.
*G11C 7/00* (2006.01)
*G11C 7/22* (2006.01)
*G11C 7/10* (2006.01)

(52) U.S. Cl.
CPC .............. *G11C 7/222* (2013.01); *G11C 7/1093* (2013.01)

(58) Field of Classification Search
None
See application file for complete search history.

(56) References Cited

U.S. PATENT DOCUMENTS

2007/0036020 A1* 2/2007 Lee et al. ................. 365/230.03
2007/0206428 A1* 9/2007 Bae et al. ...................... 365/193

FOREIGN PATENT DOCUMENTS

KR 1020090029667 A 3/2009

* cited by examiner

*Primary Examiner* — Kretelia Graham
(74) *Attorney, Agent, or Firm* — William Park & Associates Ltd.

(57) ABSTRACT

A semiconductor apparatus includes a logic memory chip including a transmission block which outputs input signals and a strobe signal; and a plurality of memory chips stacked with the logic memory chip. At least one of the plurality of memory chips includes a plurality of reception blocks. Each of the plurality of reception blocks receives an input signal among the input signals and the strobe signal, and controls a phase of any one of the input signal and the strobe signal.

19 Claims, 11 Drawing Sheets

(a) Signals outputted by transmission block (b) Signals received by first and second reception blocks (c) Phase-controlled signals

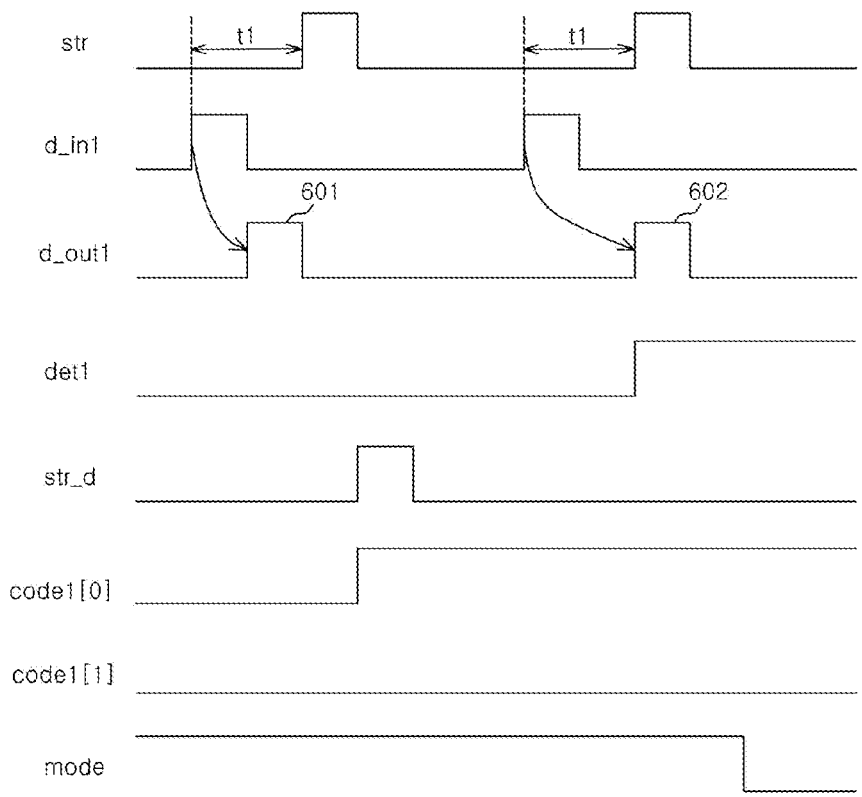

| code1[1] | code1[0] | Delay Amount |
|---|---|---|
| 0 | 0 | Large ↕ Small |
| 0 | 1 | |
| 1 | 1 | |

(a) Signals outputted by transmission block (b) Signals received by first, second and third reception blocks (c) Phase-controlled signals

SEMICONDUCTOR APPARATUS FOR CONTROLLING PHASE DIFFERENCE BETWEEN INPUT SIGNAL AND STROBE SIGNAL

CROSS-REFERENCES TO RELATED APPLICATION

The present application claims priority under 35 U.S.C. §119(a) to Korean application number 10-2013-0148513, filed on Dec. 2, 2013, in the Korean Intellectual Property Office, which is incorporated herein by reference in its entirety.

BACKGROUND

1. Technical Field

Various embodiments relate to a semiconductor apparatus, and more particularly, to a semiconductor apparatus which controls the phases of signals transmitted.

2. Related Art

In order to improve the degree of integration of a semiconductor apparatus, a 3D (three-dimensional) semiconductor apparatus, in which a plurality of memory chips are stacked and packaged, has been developed. In the 3D semiconductor apparatus, since two or more memory chips are vertically stacked, a maximum degree of integration may be achieved in the same area.

Various methods may be applied to realize the 3D semiconductor apparatus. In one of the methods, a plurality of memory chips having the same structure are stacked and are then electrically coupled with one another using wires such as metal lines to operate as one semiconductor apparatus.

Recently, a TSV (through-silicon via) type semiconductor apparatus has been disclosed in the art, in which through-silicon vias are formed to pass through a plurality of stacked memory chips so that all the memory chips are electrically coupled with one another. In the TSV type semiconductor apparatus, because the through-silicon vias vertically pass through the respective memory chips to electrically couple them with one another, the area of a package may be efficiently reduced when compared to a semiconductor apparatus in which respective memory chips are electrically coupled with one another through peripheral wiring using wires.

Respective memory chips may receive a data signal, a command signal and various control signals. Signals to be transmitted may need to be controlled in their phases due to various factors. For example, since a signal to be transmitted through a long distance from a transmission unit to a reception unit may be received by being delayed more than a signal to be transmitted through a short distance, the phase of the signal with the long transmission distance may be controlled. For another example, since a signal may be received by being delayed due to a variation in process, voltage or temperature, the phase of the signal may be controlled.

SUMMARY

In an embodiment of the present disclosure, a semiconductor apparatus includes: a logic memory chip including a transmission block which outputs input signals and a strobe signal; and a plurality of memory chips stacked with the logic memory chip, wherein at least one of the plurality of memory chips includes a plurality of reception blocks, and wherein each of the plurality of reception blocks receives an input signal among the input signals and the strobe signal, and controls a phase of any one of the input signal and the strobe signal.

In an embodiment of the present disclosure, a semiconductor apparatus includes: a first memory chip including a transmission block which outputs an input signal and a strobe signal; and a second memory chip including a reception block which receives the input signal and the strobe signal, wherein the transmission block outputs the input signal and the strobe signal such that they are simultaneously enabled for a predetermined number of times in the case of a phase control mode, and wherein the reception block sets a delay amount for any one of the input signal and the strobe signal in the case of the phase control mode.

In an embodiment of the present invention, a system comprises: a processor; a controller configured to receive one or more requests and one or more data from the processor; and a memory unit configured to receive the one or more requests and the one or more data from the controller, wherein the memory unit includes: a logic memory chip including a transmission block which outputs input signals and a strobe signal; and a plurality of memory chips stacked with the logic memory chip, wherein at least one of the plurality of memory chips includes a plurality of reception blocks, and wherein each of the plurality of reception blocks receives an input signal and controls a phase of any one of the input signals and the strobe signal.

According to the embodiments of the present disclosure, a semiconductor apparatus may efficiently control the phases of signals.

BRIEF DESCRIPTION OF THE DRAWINGS

Features, aspects, and embodiments are described in conjunction with the attached drawings, in which:

FIG. 5 is a diagram showing the relationship between first delay codes and a delay amount in the delay unit shown in FIG. 4;

FIG. 6 is a timing diagram explaining an operating method of the first reception block shown in FIG. 1;

DETAILED DESCRIPTION

Hereinafter, a semiconductor apparatus according to the present disclosure will be described below with reference to the accompanying drawings through various embodiments.

Figure 1:
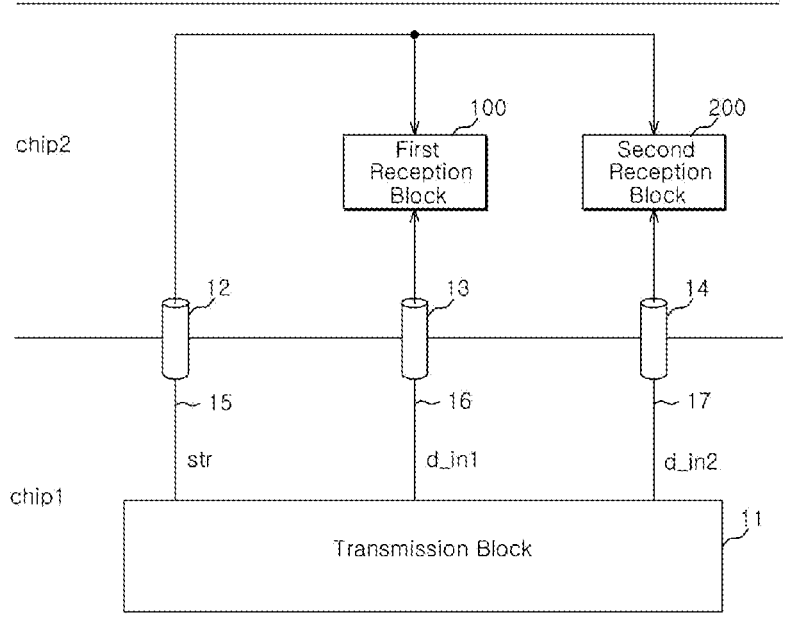
FIG. 1 is a diagram exemplarily showing a semiconductor apparatus in accordance with an embodiment of the present disclosure.

FIG. 1 is a diagram exemplarily showing a semiconductor apparatus 10 in accordance with an embodiment of the present disclosure.

A semiconductor apparatus 10 may include a first memory chip chip1 and a second memory chip chip2.

The first memory chip chip1 may be configured to control the second memory chip chip2. That is to say, the first memory chip chip1 may be a logic memory chip. The first memory chip chip1 may communicate with an external controller (not shown) to control the second memory chip chip2. The first memory chip chip1 may be stacked with the second memory chip chip2.

The first memory chip chip1 may include a transmission block 11. The transmission block 11 may output a strobe signal str, a first data input signal d_in1 and a second data input signal d_in2 through a strobe signal line 15, a first data input signal line 16 and a second data input signal line 17, respectively. The strobe signal str may be a control signal for capturing the first data input signal d_in1 and the second data input signal d_in2, at the rising edge thereof.

The second memory chip chip2 may store data which is write-requested from an outside, under the control of the first memory chip chip1. In other words, the second memory chip chip2 may be a core memory chip.

The second memory chip chip2 may include a first reception block 100 and a second reception block 200. The first reception block 100 may be configured to receive the strobe signal str and the first data input signal d_in1 of which phases may be changed during transmission and which are outputted from the transmission block 11, through the strobe signal line 15 and the first data input signal line 16. The first reception block 100 may be configured to control the phase of any one of the first data input signal d_in1 and the strobe to signal str to control the phase difference between the first data input signal d_in1 and the strobe signal str. The second reception block 200 may be configured to receive the strobe signal str and the second data input signal d_in2 which are outputted from the transmission block 11, through the strobe signal line 15 and the second data input signal line 17. The second reception block 200 may be configured to control the phase of any one of the second data input signal d_in2 and the strobe signal str to control the phase difference between the second data input signal d_in2 and the strobe signal str.

The first memory chip chip1 and the second memory chip chip2 may be electrically coupled, for example, through TSVs 12, 13 and 14, as shown in FIG. 1. The strobe signal line 15, the first data input signal line 16 and the second data input signal line 17 are electrically coupled between the first memory chip chip1 and the second memory chip chip2 through the TSVs 12, 13 and 14, to transmit signals.

Figure 2:
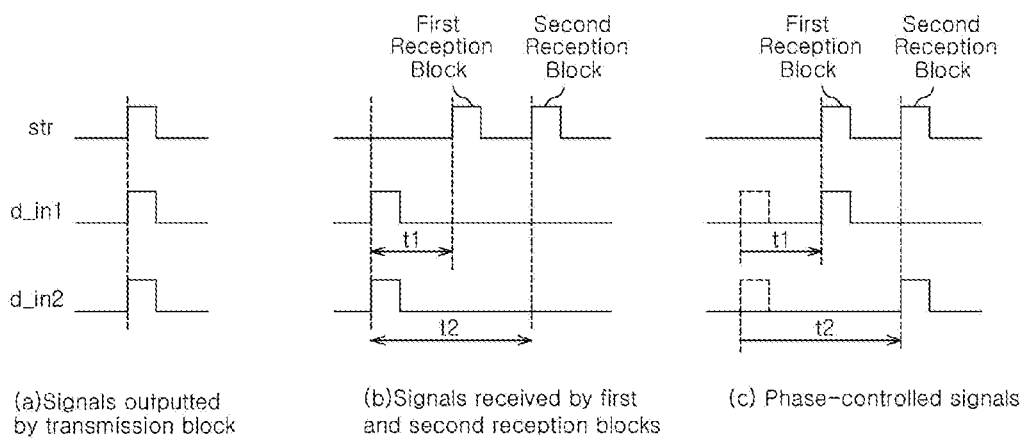
FIG. 2 is a diagram explaining a case where signals are delayed during transmission and phase differences are caused in the semiconductor apparatus shown in FIG. 1.

FIG. 2 is a diagram explaining a case where signals are delayed during transmission and phase differences are caused in the semiconductor apparatus 10 shown in FIG. 1.

For example, the transmission block 11 may output the strobe signal str, the first data input signal d_in1 and the second data input signal d_in2 such that they are simultaneously enabled ((a) of FIG. 2). Namely, the transmission block 11 may output the strobe signal str, the first data input signal d_in1 and the second data input signal d_in2 such that they have the same phase and have no phase difference.

The first reception block 100 and the second reception block 200 may receive signals which have changed phase differences due to the layout structure of lines and units. For example, as shown in FIG. 2, in the case where the first reception block 100 is disposed adjacent to the TSV 13 and the second reception block 200 is disposed adjacent to the TSV 14, times for which the first data input signal d_in1 and the second data input signal d_in2 are transmitted may be relatively shorter than a time for which the strobe signal str is transmitted. Also, in the case where the first reception block 100 is disposed closer to the TSV 12 than the second reception block 200, a time for which the strobe signal str is transmitted from the transmission block 11 to the first reception block 100 may be relatively shorter than a time for which the strobe signal str is transmitted from the transmission block 11 to the second reception block 200. As a result, the first reception block 100 may receive the strobe signal str which is delayed in its phase by t1 when compared to the first data input signal d_in1, and the second reception block 200 may receive the strobe signal str which is delayed in its phase by t2 (t2>t1) when compared to the second data input signal d_in2 ((b) of FIG. 2). That is to say, the first reception block 100 and the second reception block 200 may receive signals which are changed in their phase differences.

Accordingly, it may be necessary to control the phase differences between signals, such that the strobe signal str may precisely capture the first data input signal d_in1 and the second data input signal d_in2. For example, the phases of the first data input signal d_in1 and the second data input signal d_in2 may be appropriately controlled as shown in the drawing ((c) of FIG. 2).

Referring again to FIG. 1, the semiconductor apparatus 10 in accordance with an embodiment of the present disclosure may be configured to operate in a phase control mode and a normal mode. The phase control mode may be a mode for appropriately controlling the phase differences between signals of which phases are changed during transmission. In other words, the phase control mode may be a mode for setting delay amounts for corresponding signals, to control the phases of the signals. For example, the phase control mode may be set to operate during an idle time in which there is no data storage request from an outside. For another example, the phase control mode may be set to operate immediately after a semiconductor apparatus starts to operate.

The transmission block 11 may output the strobe signal str, the first data input signal d_in1 and the second data input signal d_in2 such that they are simultaneously enabled, that is, have the same phase, for a predetermined number of times, in the case of the phase control mode.

The first reception block 100 and the second reception block 200 may set delay amounts for the first data input signal d_in1 and the second data input signal d_in2, to control phase differences, in the case of the phase control mode. In detail, the first reception block 100 and the second reception block 200 may set delay amounts such that the rising edge of the strobe signal str exists in the enable periods of the first data input signal d_in1 and the second data input signal d_in2 which are controlled in their phases, in the case of the phase control mode.

Otherwise, the first reception block 100 and the second reception block 200 may set delay amounts for the strobe signal str, to control phase differences, in the case of the phase control mode. In detail, the first reception block 100 and the second reception block 200 may set delay amounts such that the rising edge of the strobe signal str which is controlled in its phase exists in the enable periods of the first data input signal d_in1 and the second data input signal d_in2, in the case of the phase control mode.

Hereinbelow, a case in which the first reception block 100 and the second reception block 200 set delay amounts for the first data input signal d_in1 and the second data input signal d_in2 to control phase differences will be described in detail.

Figure 3:
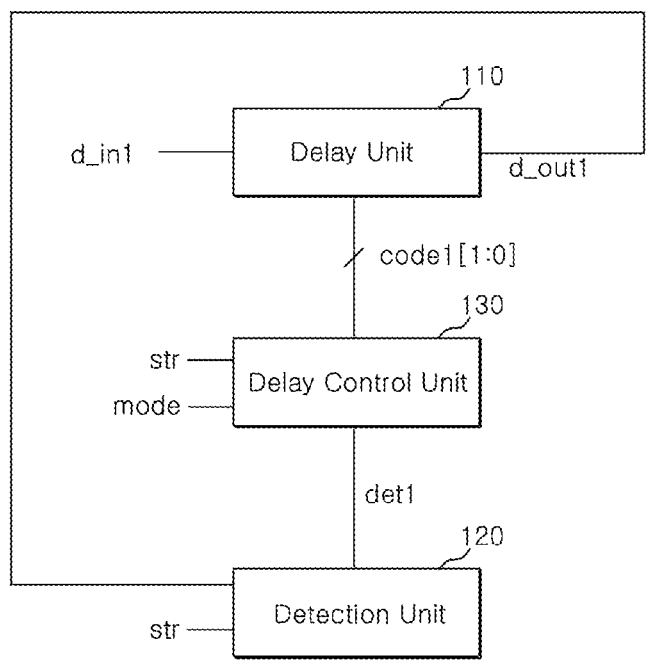
FIG. 3 is a block diagram showing the detailed configuration of the first reception block shown in FIG. 1.

FIG. 3 is a block diagram showing the detailed configuration of the first reception block 100 shown in FIG. 1.

The first reception block 100 may include a delay unit 110, a detection unit 120, and a delay control unit 130.

The delay unit 110 may be configured to receive the first data input signal d_in1, control the phase of the first data input signal d_in1 according to a delay amount set in response to first delay codes code1[1:0], and output a first data output signal d_out1.

The detection unit 120 may be configured to capture the first data output signal d_out1 by the strobe signal str and output a first detection signal det1. In detail, the detection unit 120 may output the first detection signal det1 which is disabled, in the case where a phase difference is changed in the phase control mode. The detection unit 120 may output the first detection signal det1 which is enabled, in the case where phase control is completed in the phase control mode. The detection unit 120 may transmit the first detection signal det1 which is generated as the first data output signal d_out1 is captured by the strobe signal str, to allow the first detection signal det1 to be stored in a memory region (not shown), in the normal mode.

The delay control unit 130 may be configured to generate the first delay codes code1[1:0] for setting a delay amount and output the first delay codes code1[1:0] to the delay unit 110, in response to a mode signal mode which is enabled in the phase control mode and the strobe signal str. In the case where the first detection signal det1 is disabled in the phase control mode, the delay control unit 130 may output the first delay codes code1[1:0] by increasing them in response to the strobe signal str. In the case where the first detection signal det1 is enabled in the phase control mode, the delay control unit 130 may retain and output the first delay codes code1[1:0] of the corresponding time. Further, the delay control unit 130 may continuously retain the generated first delay codes code1[1:0] and output them to the delay unit 110, in the normal mode.

Figure 4:
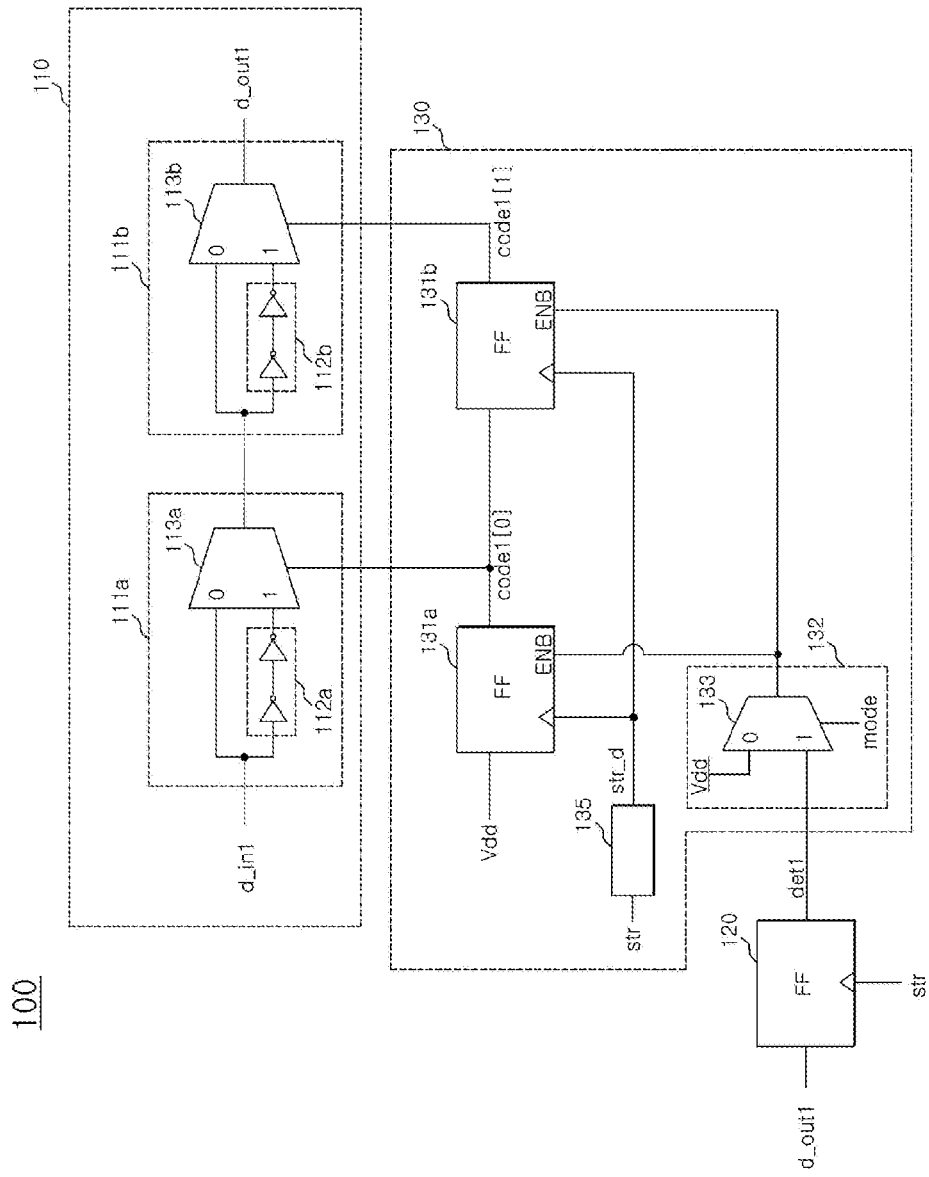
FIG. 4 is a circuit diagram showing in detail the first reception block shown in FIG. 1.

FIG. 4 is a circuit diagram showing in detail the first reception block 100 shown in FIG. 1.

The delay unit 110 may include a first sub delay section 111a and a second sub delay section 111b which control the phase of the first data input signal d_in1 in response to a lower bit signal code1[0] and an upper bit signal code1[1] corresponding to the respective bits of the first delay codes code1[1:0].

The first sub delay section 111a may include a first buffer part 112a and a first multiplexer 113a. The first buffer part 112a may be configured to delay and output the first data input signal d_in1. The first multiplexer 113a may be configured to output the first data input signal d_in1 when the lower bit signal code1[0] is logic low, and output the output signal of the first buffer part 112a when the lower bit signal code1[0] is logic high.

The second sub delay section 111b may include a second buffer part 112b, and a second multiplexer 113b which outputs the first data output signal d_out1. The second buffer part 112b may be configured to delay and output the output signal of the first sub delay section 111a. The second multiplexer 113b may be configured to output the output signal of the first sub delay section 111a when the upper bit signal code1[1] is logic low, and output the output signal of the second buffer part 112b when the upper bit signal code1[1] is logic high.

The detection unit 120 may be configured to output the first detection signal det1 which is enabled to logic high, in the case where the rising edge of the strobe signal str is inputted in a period in which the first data input signal d_in1 is enabled to logic high. Further, the detection unit 120 may be configured to output the first detection signal det1 which is disabled to logic low, in the case where the rising edge of the strobe signal str is inputted in a period in which the first data input signal d_in1 is disabled to logic low. The detection unit 120 may include, for example, a flip-flop.

The delay control unit 130 may include a mode setting section 132, a strobe signal delay section 135, a first delay code generating section 131a illustrated by FF, and a second delay code generating section 131b illustrated by FF.

The mode setting section 132 may include a third multiplexer 133. The third multiplexer 133 may output the first detection signal det1, in the case where the mode signal mode is enabled to logic high. The third multiplexer 133 may output logic high, for example, a signal of an external voltage level Vdd, in the case where the mode signal mode is disabled to logic low.

The strobe signal delay section 135 may be configured to delay the strobe signal str and output a strobe delay signal str_d.

The first delay code generating section 131a may be configured to output the lower bit signal code1[0]=0 of logic low as a preset value, when starting to operate in the phase control mode. The first delay code generating section 131a may output a signal of logic high (for example, a signal of an external voltage level) as the lower bit signal code1[0]=1 in response to the strobe delay signal str_d, in the case where the output signal of the mode setting section 132 is disabled. The first delay code generating section 131a may retain and output the lower bit signal code1[0]=1 which is being outputted, in the case where the output signal of the mode setting section 132 is enabled.

The second delay code generating section 131b may be configured to output the upper bit signal code1[1]=0 of logic low as a preset value, when starting to operate in the phase control mode. The second delay code generating section 131b may output the lower bit signal code1[0]=1 as the upper bit signal code1[1]=1 in response to the strobe delay signal str_d, in the case where the output signal of the mode setting section 132 is disabled. The second delay code generating section 131b may retain and output the upper bit signal code1[1]=1 which is being outputted, in the case where the output signal of the mode setting section 132 is enabled.

FIG. 5 is a diagram showing the relationship between first delay codes code1[1:0] and a delay amount in the delay unit 110 shown in FIG. 4.

A delay amount for the first data input signal d_in1 may be increased as the first delay codes code1[1:0] increase.

Referring to FIGS. 4 and 5, in the case where the first delay codes code1[1:0] are 00, the first sub delay section 111a and the second sub delay section 111b may output the signals inputted thereto, as they are. That is to say, the first data input signal d_in1 may be controlled in its phase according to a minimum delay amount and may be outputted as the first data output signal d_out1.

In the case where the first delay codes code1[1:0] are 01, the first sub delay section 111a may delay and output the first data input signal d_in1, and the second sub delay section 111b may output the output signal of the first sub delay section 111a as it is. In other words, the first data input signal d_in1 may be controlled in its phase according to a delay amount that is increased in comparison with a delay amount when the first delay codes code1[1:0] are 00, and may then be outputted as the first data output signal d_out1.

In the case where the first delay codes code1[1:0] are 11, the first sub delay section 111a may delay and output the first data input signal d_in1, and the second sub delay section 111b may delay and output the output signal of the first sub delay section 111a. In other words, the first data input signal d_in1 may be controlled in its phase according to a maximum delay amount and may be outputted as the first data output signal d_out1.

While it is illustrated and described heretofore that each of the first reception block 100 and the second reception block 200 includes two delay code generating sections for generating delay codes of 2 bits and two sub delay sections, it is to be noted that the present disclosure is not limited to such. Each of the first reception block 100 and the second reception block 200 may include a plurality of delay code generating sections for generating delay codes of plural bits and a plurality of sub delay sections. In this case, the configurations and operating methods of the plurality of delay code generating sections and the plurality of sub delay sections may be similar to those of the first delay code generating section 131a, the second delay code generating section 131b, the first sub delay section 111a and the second sub delay section 111b.

FIG. 6 is a timing diagram explaining an operating method of the first reception block 100 shown in FIG. 1.

Hereinbelow, an operating method of the first reception block 100 will be described in detail with reference to FIGS. 4 and 6.

First, an operating method of the first reception block 100 in the phase control mode will be described below. Before describing, it is assumed that the reception block 11 outputs the strobe signal str and the first data input signal d_in1 such that they are simultaneously enabled for a predetermined number of times.

The first reception block 100 may receive the enabled first data input signal d_in1 and may receive the enabled strobe signal str after t1. The delay unit 110 may output the first data input signal d_in1 as the first data output signal d_out1 designated by the reference numeral 601, which is controlled in its phase according to a minimum delay amount, in response to the first delay codes code1[1:0]=00. The detection unit 120 may output the first detection signal det1 which is disabled to logic low, since the rising edge of the strobe signal str exists in a period in which the first data output signal d_out1 is disabled to logic low. Since the mode signal mode is logic high, the mode setting section 132 may output the disabled first detection signal det1 as it is. The first delay code generating section 131a may output the lower bit signal of logic high code1[0]=1, in response to the disabled first detection signal det1 and the enabled strobe delay signal str_d. The second delay code generating section 131b may output the upper bit signal of logic low code1[1]=0, in response to the disabled first detection signal det1 and the enabled strobe delay signal str_d.

Then, the first reception block 100 may receive the enabled first data input signal d_in1 and may receive the enabled strobe signal str after t1. The delay unit 110 may output the first data input signal d_in1 as the first data output signal d_out1 designated by the reference numeral 602 which is controlled in its phase, in response to the first delay codes code1[1:0]=01. The detection unit 120 may output the first detection signal det1 which is enabled to logic high, since the rising edge of the strobe signal str exists in a period in which the first data output signal d_out1 is enabled to logic high. Since the mode signal mode is logic high, the mode setting section 132 may output the enabled first detection signal det1 as it is. The first delay code generating section 131a may retain and output the lower bit signal of logic high code1[0]=1, in response to the enabled first detection signal det1. The second delay code generating section 131b may retain and output the upper bit signal of logic low code1[1]=0, in response to the enabled first detection signal det1.

Setting may be made such that the phase control mode ends when the first detection signal det1 is enabled. The mode signal mode may be disabled when the phase control mode ends.

An operating method of the first reception block 100 in the normal mode after the phase control mode ends will be described below.

The delay control unit 130 may continuously retain and output the generated first delay codes code1[1:0]=01 in response to the disabled mode signal mode. The delay unit 110 may output the first data input signal d_in1 as the first data output signal d_out1 according to the delay amount set in response to the first delay codes code1[1:0]=01. The detection unit 120 may capture the first data output signal d_out1 by the strobe signal str and output the first detection signal det1. The detection signal det1 may be transmitted to allow data to be stored in a memory region.

The configuration and operating method of the first reception block 100 described above with reference to FIGS. 3 to 6 may be similar to the configuration and operating method of the second reception block 200. However, as described above with reference to FIG. 2 and will be described later, a delay amount for the second data input signal d_in2 may be set to be larger than a delay amount for the first data input signal d_in1.

Figure 7:
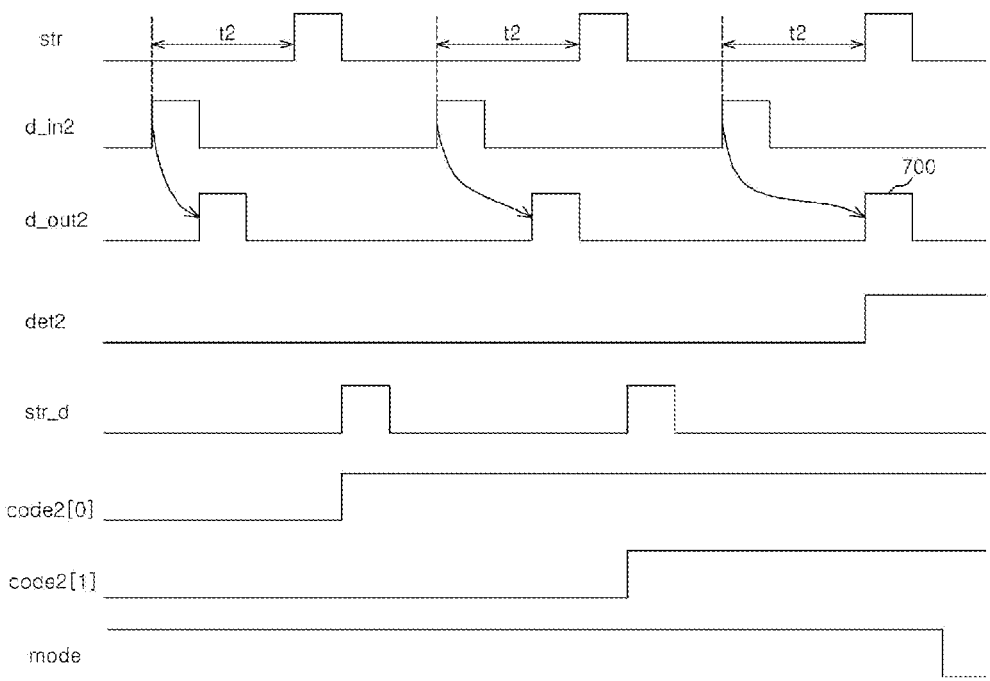
FIG. 7 is a timing diagram explaining an operating method of the second reception block shown in FIG. 1.

FIG. 7 is a timing diagram explaining an operating method of the second reception block 200 shown in FIG. 1.

Referring to FIG. 7, in the phase control mode, the second reception block 200 may receive the enabled second data input signal d_in2 and may receive the enabled strobe signal str after t2. A delay control unit may generate and output second delay codes code2[1:0] in order of 00, 01 and 11, in response to the strobe delay signal str_d. A delay unit may output a second data output signal d_out2 which is generated by controlling the phase of the second data input signal d_in2 in response to the second delay codes code2[1:0]. In this case, in a period in which the second data input signal d_in2 designated by the reference numeral 700, which is outputted when the second delay codes code2[1:0] are 11, is enabled to logic high, the rising edge of the strobe signal str may exist. At this time, a detection unit may output a second detection signal det2 which is enabled to logic high. Then, the phase control mode may end.

Since the subsequent or the other operating method of the second reception block 200 may be similar to the operating method of the first reception block 100, detailed descriptions thereof will be omitted herein.

Figure 8:
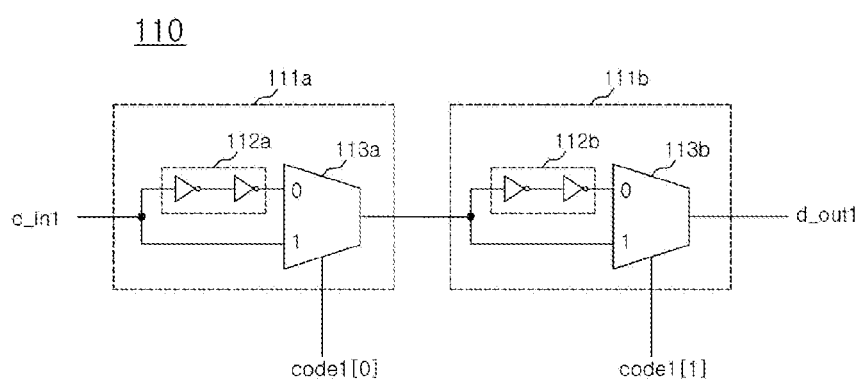
FIG. 8 is a circuit diagram showing in detail an embodiment of the delay unit shown in FIG. 4.

FIG. 8 is a circuit diagram showing in detail an embodiment of the delay unit 110 shown in FIG. 4. In the delay unit 110 shown in FIG. 8, a first multiplexer 113a may output the output of a first buffer part 112a when a lower bit signal code1[0] is logic low, and may output a first data input signal d_in1 when the lower bit signal code1[0] is logic high. Also, a second multiplexer 113b may output the output of a second buffer part 112b as a first data output signal d_out1 when an upper bit signal code1[1] is logic low, and may output the output of a first sub delay section 111a as the first data output signal d_out1 when the upper bit signal code1[1] is logic high.

Figures 9, 10:
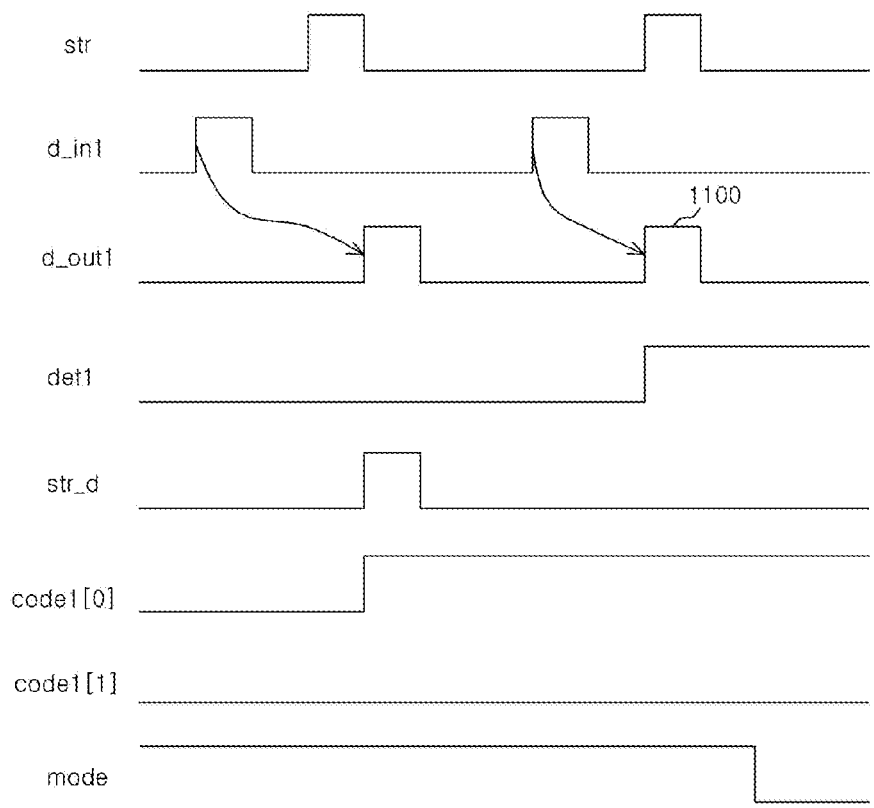
FIG. 9 is a diagram showing the relationship between first delay codes and a delay amount in the delay unit shown in FIG. 8.
FIG. 10 is a timing diagram explaining an operating method of the first reception block including the delay unit shown in FIG. 8.

FIG. 9 is a diagram showing the relationship between first delay codes code1[1:0] and a delay amount in the delay unit 110 shown in FIG. 8.

A delay amount for the first data input signal d_in1 may be decreased as the first delay codes code1[1:0] increase.

Referring to FIGS. 8 and 9, in the case where the first delay codes code1[1:0] are 00, the first sub delay section 111a may delay and output the first data input signal d_in1, and a second sub delay section 111b may delay and output the output signal of the first sub delay section 111a. In other words, the first data input signal d_in1 may be controlled in its phase according to a maximum delay amount and may be outputted as the first data output signal d_out1.

In the case where the first delay codes code1[1:0] are 01, the first sub delay section 111a may output the first data input signal d_in1 as it is, and the second sub delay section 111b may delay and output the output signal of the first sub delay section 111a. In other words, the first data input signal d_in1 may be controlled in its phase according to a delay amount that is decreased in comparison with a delay amount when the first delay codes code1[1:0] are 00, and may then be outputted as the first data output signal d_out1.

In the case where the first delay codes code1[1:0] are 11, the first sub delay section 111a and the second sub delay section 111b may output the signals inputted thereto, as they are. That is to say, the first data input signal d_in1 may be controlled in its phase according to a minimum delay amount and may be outputted as the first data output signal d_out1.

FIG. 10 is a timing diagram explaining an operating method of the first reception block 100 including the delay unit 110 shown in FIG. 8. It is assumed that the other configuration of the first reception block 100 is similar as shown in FIG. 4 except that the first reception block 100 includes the delay unit 110 of FIG. 8.

Referring to FIG. 10, in the phase control mode, the delay unit 110 may output the first data output signal d_out1 which is generated as the phase of the first data input signal d_in1 is controlled in response to the first delay codes code1[1:0]. In a period in which the first data output signal d_out1 designated by the reference numeral 1100, which is outputted when the first delay codes code1[1:0] are 01, is enabled to logic high, the rising edge of the strobe signal str may exist. At this time, the detection unit 120 may output the first detection signal det1 which is enabled to logic high. Then, the phase control mode may end. FIG. 10 also illustrates a strobe delay signal str_d.

Figure 11:
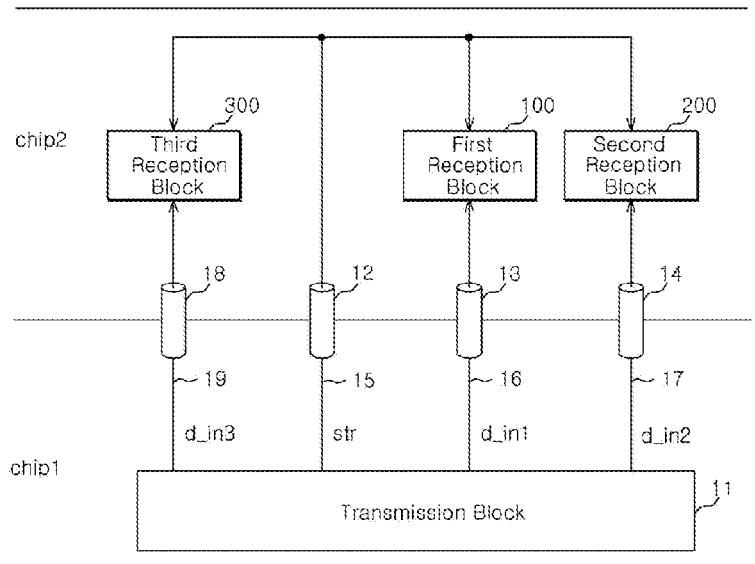
FIG. 11 is a diagram exemplarily showing a semiconductor apparatus in accordance with an embodiment of the present disclosure.

FIG. 11 is a diagram exemplarily showing a semiconductor apparatus 1000 in accordance with an embodiment of the present disclosure.

A semiconductor apparatus 1000 of FIG. 11 may include a first memory chip chip1 and a second memory chip chip2.

The first memory chip chip1 may include a transmission block 11. The transmission block 11 may output a strobe signal str, a first data input signal d_in1, a second data input signal d_in2 and a third data input signal d_in3 through a strobe signal line 15, a first data input signal line 16, a second data input signal line 17 and a third data input signal line 19, respectively.

The second memory chip chip2 may include a first reception block 100, a second reception block 200, and a third reception block 300. The third reception block 300 may be configured to receive the strobe signal str and the third data input signal d_in3 which are outputted from the transmission block 11, through the strobe signal line 15 and the third data input signal line 19. The third reception block 300 may be configured to control the phase of any one of the third data input signal d_in3 and the strobe signal str to control the phase difference between the third data input signal d_in3 and the strobe signal str. FIG. 11 also illustrates TSV 18 in addition to TSVs 12, 13 and 14 illustrated previously in FIG. 1.

Figure 12:
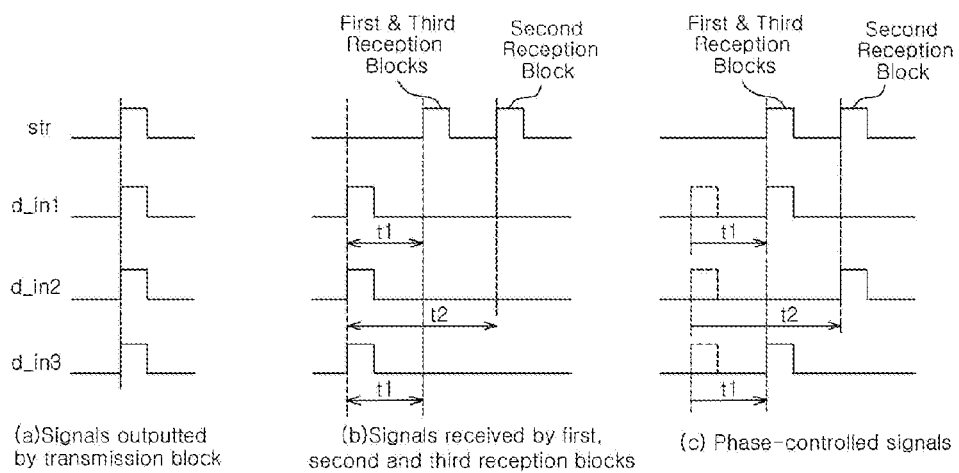
FIG. 12 is a diagram explaining a case where signals are delayed during transmission and phase differences are caused in the semiconductor apparatus shown in FIG. 11.

FIG. 12 is a diagram explaining a case where signals are delayed during transmission and phase differences are caused in the semiconductor apparatus 1000 shown in FIG. 11.

For example, the transmission block 11 may output the strobe signal str, the first data input signal d_in1, the second data input signal d_in2 and the third data input signal d_in3 such that they are simultaneously enabled ((a) of FIG. 12). Namely, the transmission block 11 may output the strobe signal str, the first data input signal d_in1, the second data input signal d_in2 and the third data input signal d_in3 such that they have the same phase and have no phase difference.

The third reception block 300 may receive signals which have changed phase differences, similarly to the first reception block 100 and the second reception block 200. However, the third reception block 300 may have a signal delay characteristic that is similar to that of the first reception block 100. The third reception block 300 may receive signals of which phase differences are changed similarly to the case of the first reception block 100 ((b) of FIG. 12).

In this case, the third reception block 300 may control phases in a manner similar to the first reception block 100 ((c) of FIG. 12).

Figure 13:
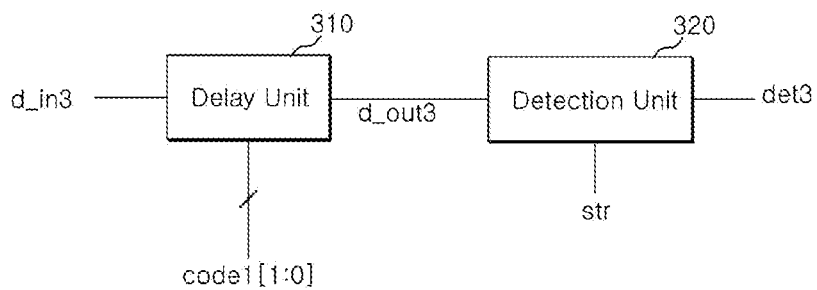
FIG. 13 is a block diagram exemplarily showing the configuration of the third reception block shown in FIG. 11.

FIG. 13 is a block diagram exemplarily showing the configuration of the third reception block 300 shown in FIG. 11. Referring to FIG. 13, there is shown the third reception block 300 which is configured to control the phase of the received third data input signal d_in3 in response to first delay codes code1[1:0] generated by the first reception block 100. Before describing, it is assumed that the first reception block 100 and the second reception block 200 of FIG. 11 are configured in the same manner as the first reception block 100 of FIGS. 3 and 4.

As aforementioned, the third reception block 300 may control a phase in a similar manner to the first reception block 100. That is to say, the third reception block 300 may delay the third data input signal d_in3 by an amount by which the first reception block 100 delays the first data input signal d_in1. In this case, the third reception block 300 does not need to separately perform the phase control mode. The third reception block 300 may apply the delay amount set in the first reception block 100 as it is, in the phase control mode. To this end, the third reception block 300 may be transmitted with the first delay codes code1[1:0] which are generated by the first reception block 100.

In detail, the third reception block 300 may not include a delay control unit which generates the first delay codes code1[1:0], unlike the first reception block 100 of FIG. 11. Instead, a delay unit 310 may be transmitted with the first delay codes code1[1:0] which are generated by the first reception block 100, in a normal mode. The delay unit 310 may control the phase of the received third data input signal d_in3 according to a delay amount set in response to the first delay codes code1[1:0], and output a third data output signal d_out3. A detection unit 320 may capture the third data output signal d_out3 by the strobe signal str, and output a third detection signal det3. The detection unit 320 may transmit the third detection signal det3, to allow the third detection signal det3 to be stored in a memory region (not shown).

The configurations and operating methods of the delay unit 310 and the detection unit 330 may be similar to the configurations and the operating methods of the delay unit 110 and the detection unit 120 of FIG. 4. Therefore, detailed descriptions thereof will be omitted herein.

While it is illustrated and described heretofore that the semiconductor apparatus in accordance with the embodiments of the present disclosure includes one core memory chip (that is, the second memory chip chip2 of FIG. 1), it is to be noted that the present disclosure is not limited to such. The semiconductor apparatus may include a plurality of core memory chips. Each of the plurality of core memory chips may receive a strobe signal and a plurality of data input signals from a transmission block. In this case, each of the plurality of core memory chips may include a plurality of reception blocks which may be configured similarly to the first reception block 100 and the third reception block 300.

Figure 14:
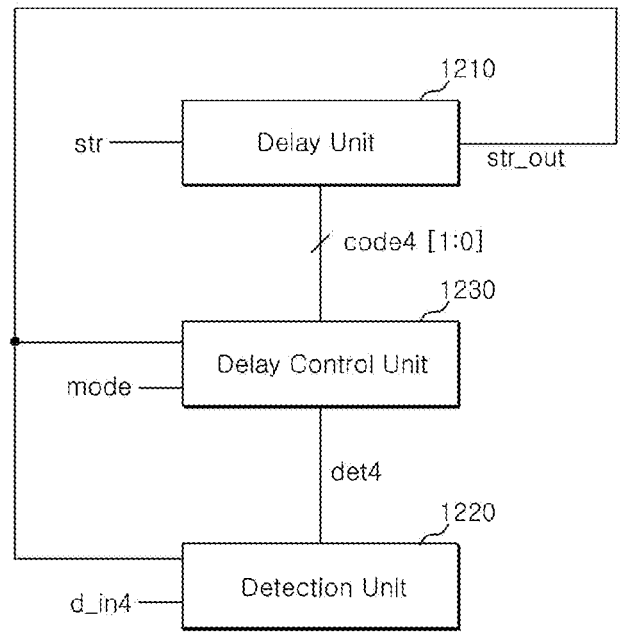
FIG. 14 is a block diagram exemplarily showing a reception block in accordance with an embodiment of the present disclosure.

FIG. 14 is a block diagram exemplarily showing a reception block 1200 in accordance with an embodiment of the present disclosure.

In the embodiments of the present disclosure which are described with reference to FIGS. 1 to 13, a reception block which receives a data input signal and a strobe signal has controlled the phase of the data input signal to control the phase difference between changed signals. However, for example, in the case where a data input signal is received by being delayed more than a strobe signal due to a layout structure or the like, the phase of the strobe signal may be controlled.

Referring to FIG. 14, a reception block 1200 may include a delay unit 1210, a detection unit 1220, and a delay control unit 1230, similarly to the reception block 100 of FIG. 3. The delay unit 1210 may be configured to receive a strobe signal str, control the phase of the strobe signal str according to a set delay amount, and output a strobe output signal str_out. The detection unit 1220 may be configured to capture a fourth data input signal d_in4 by the strobe output signal str_out, and output a fourth detection signal det4. The delay control unit 1230 may be configured to generate fourth delay codes code4[1:0] of, for example, 2 bits, for setting a delay a mount, in response to a mode signal mode which is enabled in a phase control mode and the strobe output signal str_out, and output the fourth delay codes code4[1:0] to the delay unit 1210.

Figure 15:
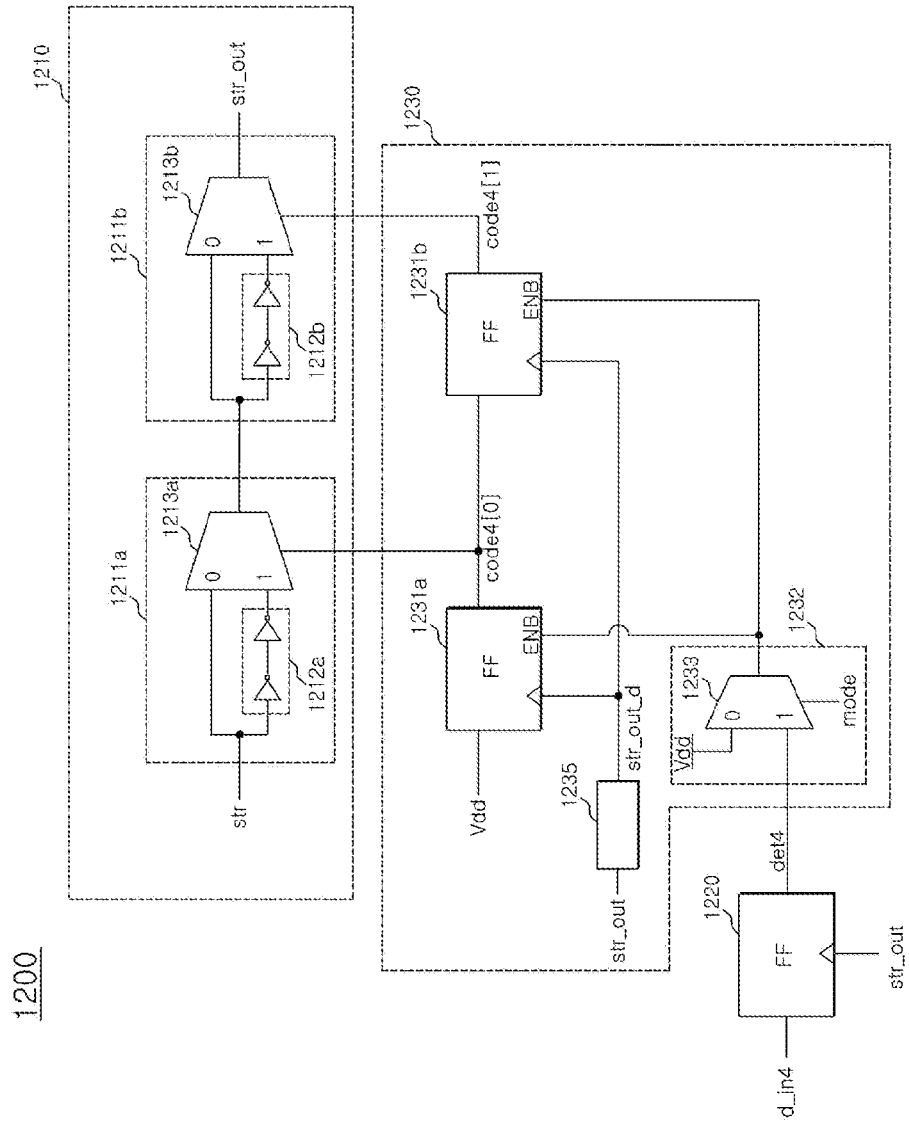
FIG. 15 is a circuit diagram showing in detail the configuration of the reception block shown in FIG. 14.

FIG. 15 is a circuit diagram showing in detail the configuration of the reception block 1200 shown in FIG. 14.

The delay control unit 1230 may increase and output the fourth delay codes code4[1:0] in response to the strobe output signal str_out, in the case where the fourth detection signal det4 is disabled in the phase control mode. In the case where the fourth detection signal det4 is enabled in the phase control mode, the delay control unit 1230 may retain and output the fourth delay codes code4[1:0] of the corresponding time. The delay control unit 1230 may include sub delay control sections 1231a and 1231b which are configured to respectively output bit signals corresponding to the respective bits of the fourth delay codes code4[1:0], and the delay unit 1210 may include sub delay sections 1211a and 1211b which are configured to control the phase of the strobe signal str in response to the respective bit signals.

The operating method of the reception block 1200 shown in FIG. 15 may be similar to the operating method of the reception block 100 shown in FIG. 4. Therefore, detailed descriptions thereof will be omitted herein. FIG. 15 also illustrates strobe output delay signal str_out_d which is similar to the strobe delay signal str_d of FIG. 4 and other previous figures discussed above.

Figure 16:
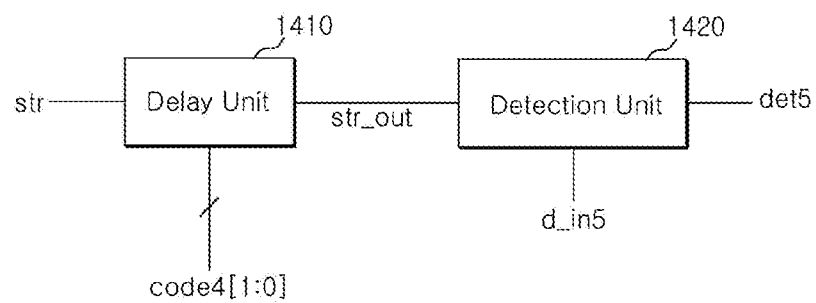
FIG. 16 is a block diagram exemplarily showing the configuration of a reception block in accordance with an embodiment of the present disclosure.

In the case where a semiconductor apparatus includes a plurality of reception blocks, a certain reception block may control the phase of the strobe signal str by receiving the fourth delay codes code4[1:0] generated by the reception block 1200 of FIG. 14. FIG. 16 is a block diagram exemplarily showing the configuration of a reception block 1400 in accordance with an embodiment of the present disclosure. The configuration and operating method of the reception block 1400 shown in FIG. 16 may be similar to the configuration and operating method of the third reception block 300 shown in FIG. 13. Therefore, detailed descriptions thereof will be omitted herein.

Figure 17:
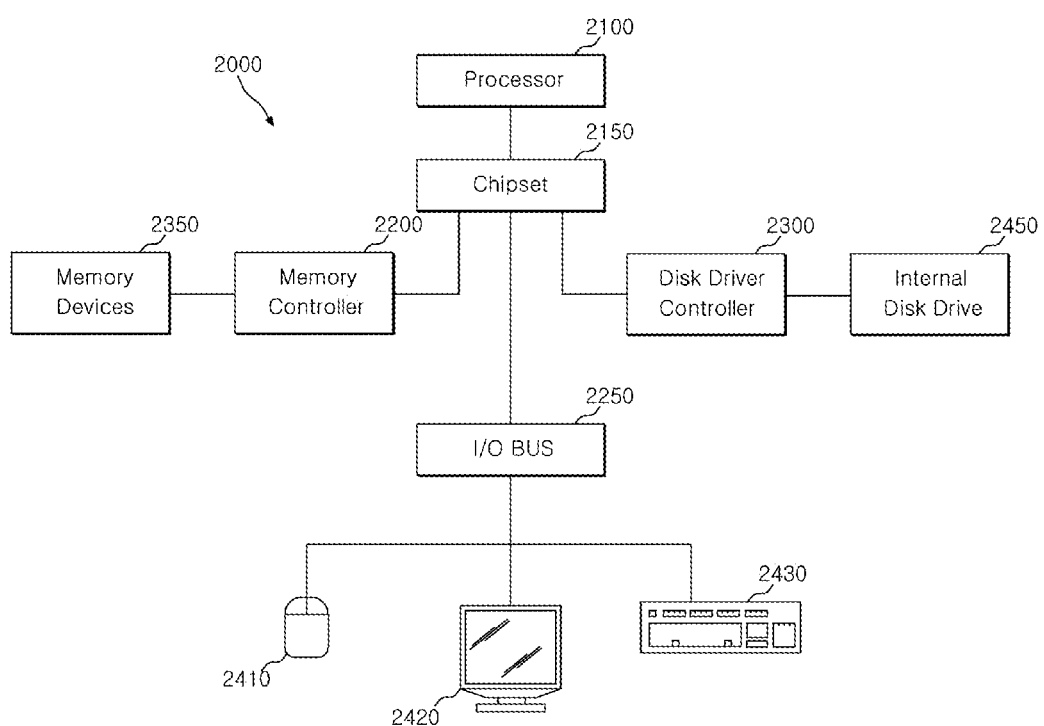
FIG. 17 illustrates a block diagram of a system employing a memory controller circuit in accordance with an embodiment of the present invention.

Referring to FIG. 17, a system 2000 may include one or more processors 2100. The processor 2100 may be used individually or in combination with other processors. A chipset 2150 may be operably coupled to the processor 2100. The chipset 2150 is a communication pathway for signals between the processor 2100 and other components of the system 2000, which may include a memory controller 2200, an input/output ("I/O") bus 2250, and a disk drive controller 2300. Depending on the configuration of the system 2000, any one of a number of different signals may be transmitted through the chipset 2150.

The memory controller 2200 may be operably coupled to the chipset 2150. The memory controller can receive one or more request provided from the processor 2100, through the chipset 2150. The memory controller 2200 may be operably coupled to one or more memory devices 2350. The memory devices 2350 may correspond to the semiconductor apparatus 10 described above.

The chipset 2150 may also be coupled to the I/O bus 2250. The I/O bus 2250 may serve as a communication pathway for signals from the chipset 2150 to I/O devices 2410, 2420 and 2430. The I/O devices 2410, 2420 and 2430 may include a mouse 2410, a video display 2420, or a keyboard 2430. The I/O bus 2250 may employ any one of a number of communications protocols to communicate with the I/O devices 2410, 2420 and 2430.

The disk drive controller 2300 may also be operably coupled to the chipset 2150. The disk drive controller 2350 may serve as the communication pathway between the chipset 2150 and one or more internal disk drives 2450. The internal disk drive 2450 and the disk drive controller 2300 may communicate with the chipset 2150 using virtually any type of communication protocol, including all of those mentioned above with regard to the I/O bus 2250.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a logic memory chip including a transmission block which outputs input signals and a strobe signal; and
   a core memory chip stacked with the logic memory chip, wherein the core memory chip includes a plurality of reception blocks, and wherein each of the plurality of reception blocks receives an input signal among the input signals and the strobe signal, and controls a phase of any one of the input signal and the strobe signal, wherein each of the plurality of reception blocks comprises:

a delay unit configured to receive the input signal, control a phase of the input signal according to a set delay amount, and output an output signal; and a detection unit configured to capture the output signal by the strobe signal, and output a detection signal.

2. The semiconductor apparatus according to claim 1, wherein the transmission block outputs the input signals and the strobe signal to at least one of the plurality of reception blocks such that the input signals and the strobe signal are simultaneously enabled for a predetermined number of times in the case of a phase control mode.

3. The semiconductor apparatus according to claim 2, wherein the at least one of the plurality of reception blocks further comprises:

a delay control unit configured to generate delay codes for setting the delay amount, in response to a mode signal which is enabled in the phase control mode, and output the delay codes to the delay unit.

4. The semiconductor apparatus according to claim 3, wherein the delay control unit increases and outputs the delay codes in response to the strobe signal in the case where the detection signal is disabled in the phase control mode, and retains and outputs the delay codes in the case where the detection signal is enabled in the phase control mode.

5. The semiconductor apparatus according to claim 3, wherein the delay control unit comprises sub delay control sections which respectively output a bit signal corresponding to each of bits of the delay codes, and wherein the delay unit comprises sub delay sections which control the phase of the input signal in response to respective bit signals.

6. The semiconductor apparatus according to claim 3, wherein the plurality of reception blocks comprise a reception block configured to control the phase of the input signal in response to the delay codes received from the delay control unit of the at least one of the plurality of reception blocks.

7. A semiconductor apparatus comprising:

a logic memory chip including a transmission block which outputs input signals and a strobe signal; and a core memory chip stacked with the logic memory chip, wherein the core memory chip includes a plurality of reception blocks, and wherein each of the plurality of reception blocks receives an input signal among the input signals and the strobe signal, and controls a phase of any one of the input signal and the strobe signal, wherein each of the plurality of reception blocks comprises:

a delay unit configured to receive the strobe signal, control a phase of the strobe signal according to a set delay amount, and output a strobe output signal; and a detection unit configured to capture the input signal by the strobe output signal, and output a detection signal.

8. The semiconductor apparatus according to claim 7, wherein the transmission block outputs the input signals and the strobe signal to at least one of the plurality of reception blocks such that the input signals and the strobe signal are simultaneously enabled for a predetermined number of times in the case of a phase control mode.

9. The semiconductor apparatus according to claim 8, wherein the at least one of the plurality of reception blocks further comprises:

a delay control unit configured to generate delay codes for setting the delay amount, in response to a mode signal which is enabled in the phase control mode and the strobe output signal, and output the delay codes to the delay unit.

10. The semiconductor apparatus according to claim 9, wherein the delay control unit increases and outputs the delay codes in response to the strobe output signal in the case where the detection signal is disabled in the phase control mode, and retains and outputs the delay codes in the case where the detection signal is enabled in the phase control mode.

11. The semiconductor apparatus according to claim 9, wherein the delay control unit comprises sub delay control sections which respectively output a bit signal corresponding to each of bits of the delay codes, and wherein the delay unit comprises sub delay sections which control the phase of the strobe signal in response to respective bit signals.

12. The semiconductor apparatus according to claim 9, wherein the plurality of reception blocks comprise a reception block configured to control the phase of the input signal in response to the delay codes received from the delay control unit of the at least one of the plurality of reception blocks.

13. A semiconductor apparatus comprising:

a first memory chip including a transmission block which outputs an input signal and a strobe signal; and a second memory chip including a reception block which receives the input signal and the strobe signal, wherein the transmission block outputs the input signal and the strobe signal such that the input signals and the strobe signal are simultaneously enabled for a predetermined number of times in the case of a phase control mode, and wherein the reception block sets a delay amount for any one of the input signal and the strobe signal in the case of the phase control mode, wherein the reception block comprises:

a delay unit configured to receive the input signal, control a phase of the input signal according to a set delay amount, and output an output signal;

a detection unit configured to capture the output signal by the strobe signal, and output a detection signal; and a delay control unit configured to generate delay codes for setting the delay amount, in response to a mode signal which is enabled in the phase control mode and the strobe signal, and output the delay codes to the delay unit.

14. The semiconductor apparatus according to claim 13, wherein the delay control unit increases and outputs the delay codes in response to the strobe signal in the case where the detection signal is disabled in the phase control mode, and retains and outputs the delay codes in the case where the detection signal is enabled in the phase control mode.

15. The semiconductor apparatus according to claim 13, wherein the delay control unit comprises sub delay control sections which respectively output bit signals corresponding to respective bits of the delay codes, and wherein the delay unit comprises sub delay sections which control the phase of the input signal in response to the respective bit signals.

16. A semiconductor apparatus comprising:

a first memory chip including a transmission block which outputs an input signal and a strobe signal; and a second memory chip including a reception block which receives the input signal and the strobe signal, wherein the transmission block outputs the input signal and the strobe signal such that the input signals and the strobe signal are simultaneously enabled for a predetermined number of times in the case of a phase control mode, and wherein the reception block sets a delay amount for any one of the input signal and the strobe signal in the case of the phase control mode, wherein the reception block comprises:

a delay unit configured to receive the strobe signal, control a phase of the strobe signal according to a set delay amount, and output a strobe output signal;

a detection unit configured to capture the input signal by the strobe output signal, and output a detection signal; and a delay control unit configured to generate delay codes for setting the delay amount, in response to a mode signal which is enabled in the phase control mode and the strobe output signal, and output the delay codes to the delay unit.

17. The semiconductor apparatus according to claim 16, wherein the delay control unit increases and outputs the delay codes in response to the strobe output signal in the case where the detection signal is disabled in the phase control mode, and retains and outputs the delay codes in the case where the detection signal is enabled in the phase control mode.

18. The semiconductor apparatus according to claim 16, wherein the delay control unit comprises sub delay control sections which respectively output a bit signal corresponding to each of bits of the delay codes, and wherein the delay unit comprises sub delay sections which control the phase of the strobe signal in response to respective bit signals.

19. A system comprising:

a processor;

a controller configured to receive one or more requests and one or more data from the processor; and a memory unit configured to receive the one or more requests and the one or more data from the controller, wherein the memory unit comprises:

a logic memory chip including a transmission block which outputs input signals and a strobe signal; and a core memory chip stacked with the logic memory chip, wherein the core memory chip includes a plurality of reception blocks, and wherein each of the plurality of receptions blocks receives an input signal among the input signals and the strobe signal and controls a phase of any one of the input signal and the strobe signal, wherein each of the plurality of reception blocks comprises:

a delay unit configured to receive the input signal, control a phase of the input signal according to a set delay amount, and output an output signal; and a detection unit configured to capture the output signal by the strobe signal, and output a detection signal.

* * * * *